(12) United States Patent
Choi

(10) Patent No.: US 6,324,222 B1
(45) Date of Patent: Nov. 27, 2001

(54) DIGITAL RECEIVER WITH POLYPHASE STRUCTURE

(75) Inventor: Gin-Kyu Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/143,838

(22) Filed: Aug. 31, 1998

(30) Foreign Application Priority Data

Aug. 29, 1997 (KR) .................................................. 97-42727

(51) Int. Cl.[7] .............................. H03D 3/00; H04L 27/22
(52) U.S. Cl. .......................................... 375/322; 375/329
(58) Field of Search .................................... 375/271, 280, 375/281, 279, 316, 322, 324, 329, 332; 329/304; 455/296

(56) References Cited

U.S. PATENT DOCUMENTS

| | | | |
|---|---|---|---|
| 4,893,316 | 1/1990 | Janc et al. | 375/261 |
| 4,910,752 | 3/1990 | Yester, Jr. et al. | 375/316 |
| 5,521,944 | 5/1996 | Hegeler et al. | 375/329 |
| 5,715,259 | 2/1998 | Lee et al. | 714/775 |
| 5,715,529 | 2/1998 | Kianush et al. | 455/266 |
| 5,787,125 | * 7/1998 | Mittel | 375/329 |
| 6,215,828 | * 4/2001 | Signell et al. | 375/316 |

* cited by examiner

Primary Examiner—Betsy L. Deppe
(74) Attorney, Agent, or Firm—Dilworth & Barrese, LLP

(57) ABSTRACT

A digital receiver with a polyphase structure extracts specific channel data from multi-channel discrete time data. An input signal is sequentially delayed by a plurality of delays connected in series. The input signal and each sequentially delayed signal are processed by two down-samplers, for lowering the sampling rate, and two filters, for filtering for a desired channel of the input signal. Each down-sampler is connected in series with one filter. Also included are two pluralities of adders, the number of adders of each plurality is equal, and each of the adders of each plurality is connected in series. The number of adders is equal to two times the number of delays. The adders recombine the outputs of the filters (or down-samplers, depending on the order of the series connection), each adder recombining two filter outputs. The order that the adders recombine the signal coincides with the order that the signal was delayed. By sequentially delaying the digital input signal, down sampling and filtering each sequentially delayed signal, and recombining the filtered signals, the time data can be processed at a lower rate than the digital input signal rate.

7 Claims, 3 Drawing Sheets

DIGITAL RECEIVER WITH POLYPHASE STRUCTURE

BACKGROUND OF THE INVENTION

1. Field of the Invention

The present invention relates to a digital receiver, and more particularly, to an apparatus for extracting specific channel data from multi-channel discrete time data.

2. Description of the Related Art

A digital receiver receives discrete time data converted from a multi-channel analog signal through an analog-to-digital (A/D) converter and extracts desired channel data therefrom.

As illustrated in FIG. 1, a conventional digital receiver includes multipliers 10 and 12, a local oscillator 14, and a low pass filter (LPF) 16. The LPF 16 may be a decimating low pass FIR (Finite Impulse Response) filter.

In operation, an input signal S[n] applied to an input terminal of the digital receiver is a digital signal consisting of an I channel component and a Q channel component. An example of the input signal S[n] can be given by:

$$S[n]=I[n] \cdot \cos W_s n + Q[n] \cdot \sin W_s n \qquad (1)$$

where $I[n] \cdot \cos W_s n$ and $I[n] \cdot \sin W_s n$ denote the I channel component and the Q channel component, respectively.

The input signal S[n] is multiplied through the multipliers 10 and 12 by intermediate frequency signals $\sin[W_s n]$ and $\cos[W_s n]$, respectively. The multipliers 10,12 generate both a baseband signal and a high frequency signal. The intermediate frequency signals $\cos[W_s n]$ and $\sin[W_s n]$ are produced from the local oscillator 14. The baseband signal and the high frequency signal generated from the multipliers 10 and 12 are supplied to the LPF 16 which removes the high frequency component and passes only the baseband signal that the user desires to receive.

In the above structure of the digital receiver, since the input signal S[n] is a sampled digitally converted signal, the multipliers 10 and 12 should have the same data processing rate as a sampling rate of the input signal S[n]. If the sampling rate of the input signal S[n] is high, then multipliers 10 and 12 must be high speed devices so as to process the input signal S[n] with a high sampling rate. This presents a disadvantage in that if the digital receiver is achieved by using a commercially available DSP (Digital Signal Processor) chip, a high-speed multiplier must be provided in the DSP chip. Even though such multipliers can be achieved on an integrated circuit chip, the complicated multiplier has an adverse effect on other processors, and thus a single DSP chip cannot be used.

SUMMARY OF THE INVENTION

It is therefore an object of the present invention to provide a digital receiver which can reduce a processing load by arranging a multiplier at the rear thereof so as to allow operation at a lower data processing rate.

To achieve the above object, a digital receiver having a polyphase structure is provided by the present invention which has an input terminal for receiving a digital input signal converted by a given sampling rate and includes: a plurality of delays for sequentially delaying the input signal or an output of the preceding delay; a first branch having a first down-sampler for lowering a sampling rate of the input signal within the possible range according to a unique characteristic of the input signal, a plurality of down-samplers for lowering a sampling rate of the input signal within the possible range according to a unique characteristic of the input signal, a first filter for filtering only a signal of a desired channel from a signal received from the first down-sampler, a plurality of filters for filtering only signals of a desired channel from signals received from the plurality of down-samplers, a first adder for adding an output of the first filter to an output of the following filter, and a plurality of adders for respectively adding an output of the preceding adder to the corresponding filter; a second branch having the same construction as the first branch, the first and second branch being symmetric on the basis of the delays; a first multiplier for multiplying an output of the last adder of the first branch by $e^{-jW_sMn}$, a second multiplier for multiplying an output of the last adder of the second branch by $e^{jW_sMn}$; a second adder for adding outputs of the first and second multipliers to each other to generate a signal corresponding to an I channel; a third adder for generating a difference between outputs of the first and second multipliers; and a third multiplier for multiplying an output of the third adder by a complex number to generate a signal corresponding to a Q channel.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

An input signal according to the present invention is a digital signal converted by an A/D converter preceding a digital receiver. It will be apparent that a prescribed sampling frequency is used to convert an analog signal to the digital signal. A sampling rate for sampling the analog signal is determined by the sampling frequency. If the sampling frequency increases, the sampling rate increases in proportion thereto. In the following description, the above terms will be used without additionally describing the previously stated contents.

Figure 2:
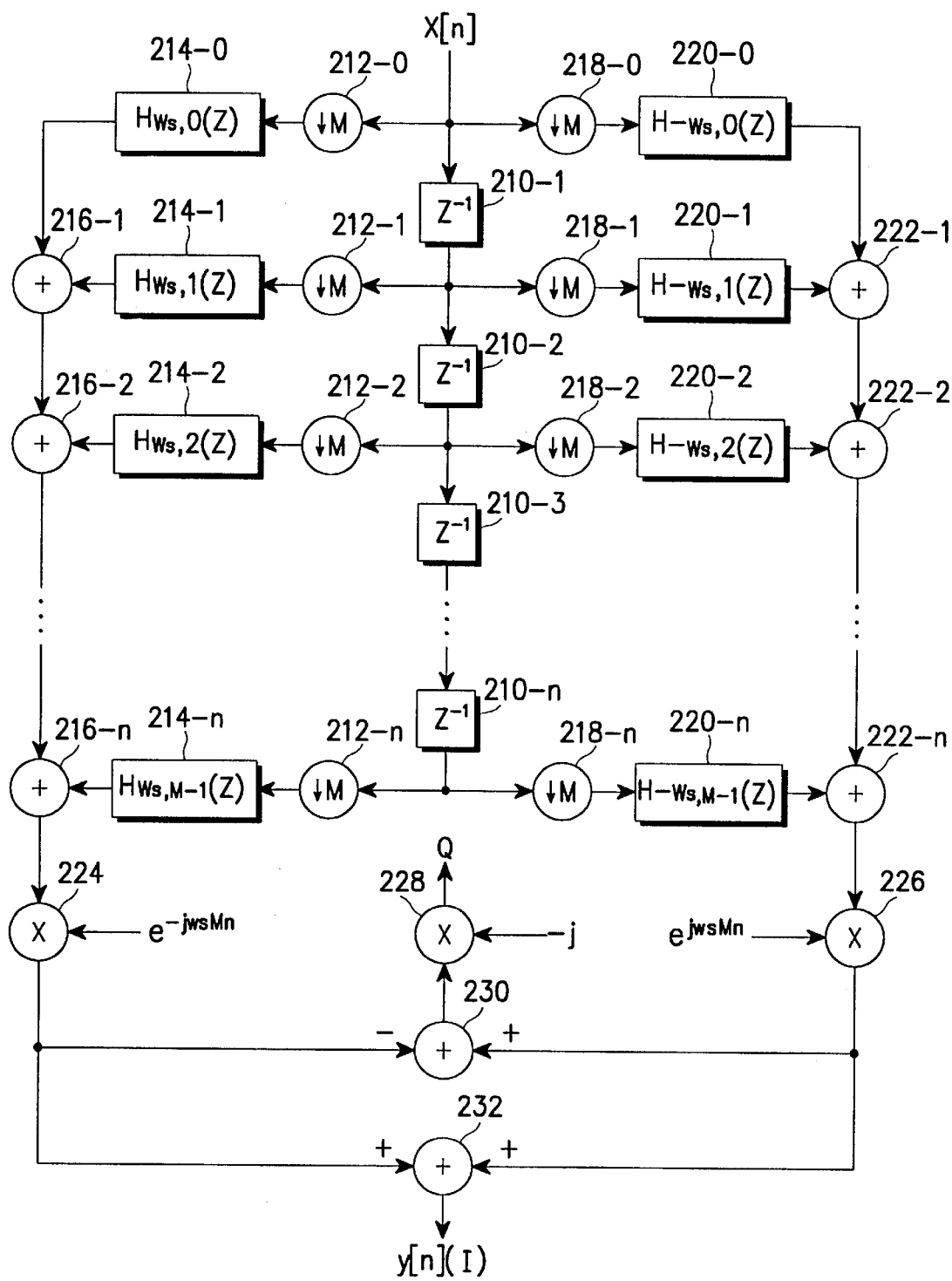
FIG. 2 is a block diagram of a digital receiver with a polyphase structure according to a preferred embodiment of the present invention.

Referring to FIG. 2, a digital receiver according to a preferred embodiment of the present invention includes: adders 216-1, . . . 216-n, 222-1, . . . , 222-n, 230 and 232; filters 214-0, . . . , 214-n and 220-0, . . . , 220-n, down-samplers 212-0, . . . 212-n and 218-0, . . . , 218-n, delays 210-1, . . . , 210-n, and multipliers 224, 226 and 228.

The down-samplers 212-0, . . . 212-n and 218-0, . . . , 218-n receive a discrete time signal x[n] having a frequency (sampling rate) fs and produce an output signal which occurs at time periods equal to multiples of M, where M is an integer and is chosen so that aliasing can be avoided. Although not shown in FIG. 2, the frequency fs denotes a sampling frequency used in an A/D converter connected to an input stage.

The filters 214-0, . . . , 214-n and 220-0, . . . , 220-n have a polyphase structure of a prototype filter which has a function for multiplying an output of the decimating low pass FIR filter 16 (shown in FIG. 1) by a complex gain, including an intermediate frequency of a desired channel. The polyphase structure is described in detail in IEEE, Vol. 73, January 1990, pp. 56–93, "Multirate Digital Filters, Filter Banks, Polyphase Networks, and Application" by Vaidyanathan.

The delays 210-1, ..., 210-n each delay the input signal x[n] by one sampling period, respectively.

The adders 216-1, ... 216-n and 222-1, ..., 222-n add two signals, provided either from two filters or from a previous adder and a filter, to each other during each sampling period. For example, the adder 216-1 adds signals generated from the filters 214-0 and 214-1 to each other. The adder 222-1 adds signals generated from the filters 220-0 and 220-1 to each other. The adders 232 and 230 generate a sum signal and a difference signal, respectively, between signals generated from the multipliers 224 and 226 with respect to every sampling period. The other adders each add signals generated from the preceding adder and a corresponding filter to each other.

The multiplier 224 generates a signal obtained by multiplying sampling data by $e^{-jW_sMn}$. The multiplier 226 generates a signal obtained by multiplying sampling data by $e^{jW_sMn}$.

The delays 210-1, ..., 210-n are interconnected to each other so as to sequentially delay the input signal x[n] by one sampling period. The down-samplers 212-0, ..., 212-n and the filters 214-0, ..., 214-n are connected in series pairs to the inputs of the adders 216-1, ..., 216-n. Down-sampler 212-0 and filter 214-0 are connected in a pair between an input signal terminal and the adder 216-1. The down-samplers 212-1, ..., 212-n and the filters 214-1, ..., 214-n are connected in pairs between the outputs of the delays 210-1, ..., 210-n and the adders 216-1, ..., 216-n.

The down-samplers 218-0, ..., 218-n, the filters 220-0, ..., 220-n, and the adders 221-1, ..., 222-n have a symmetric structure with the down-samplers 212-0, ..., 212-n, the filters 214-0, ..., 214-n, and the adders 216-1, ..., 216-n on the basis of the delays 210-1, ..., 210-n. That is, both sides are connected to delays 210-1, ..., 210-n with similar construction. Hereinafter, the down-samplers 212-0, ..., 212-n, the filters 214-0, ..., 214-n, and the adders 216-1, ..., 216-n will be referred to as a first branch; and the down-samplers 218-0, ..., 218-n, the filters 220-0, ..., 220-n, and the adders 221-1, ..., 222-n will be referred to as a second branch.

The output of the adder 216-n of the first branch is connected to the multiplier 224, and the output of the adder 222-n of the second branch is connected to the multiplier 226. The outputs of the multiplier 224 is connected to an inverting input of adder 230 and a non-inverting input of adder 232. The output of the multiplier 226 is connected to non-inverting inputs of adders 230 and 232. The output of the adder 230 is connected to the multiplier 228. Multiplier 228 multiplies the output of multiplier 230 by a complex number to provide a resultant Q output signal. The output of adder 232 is a resultant I output signal.

Figure 1:
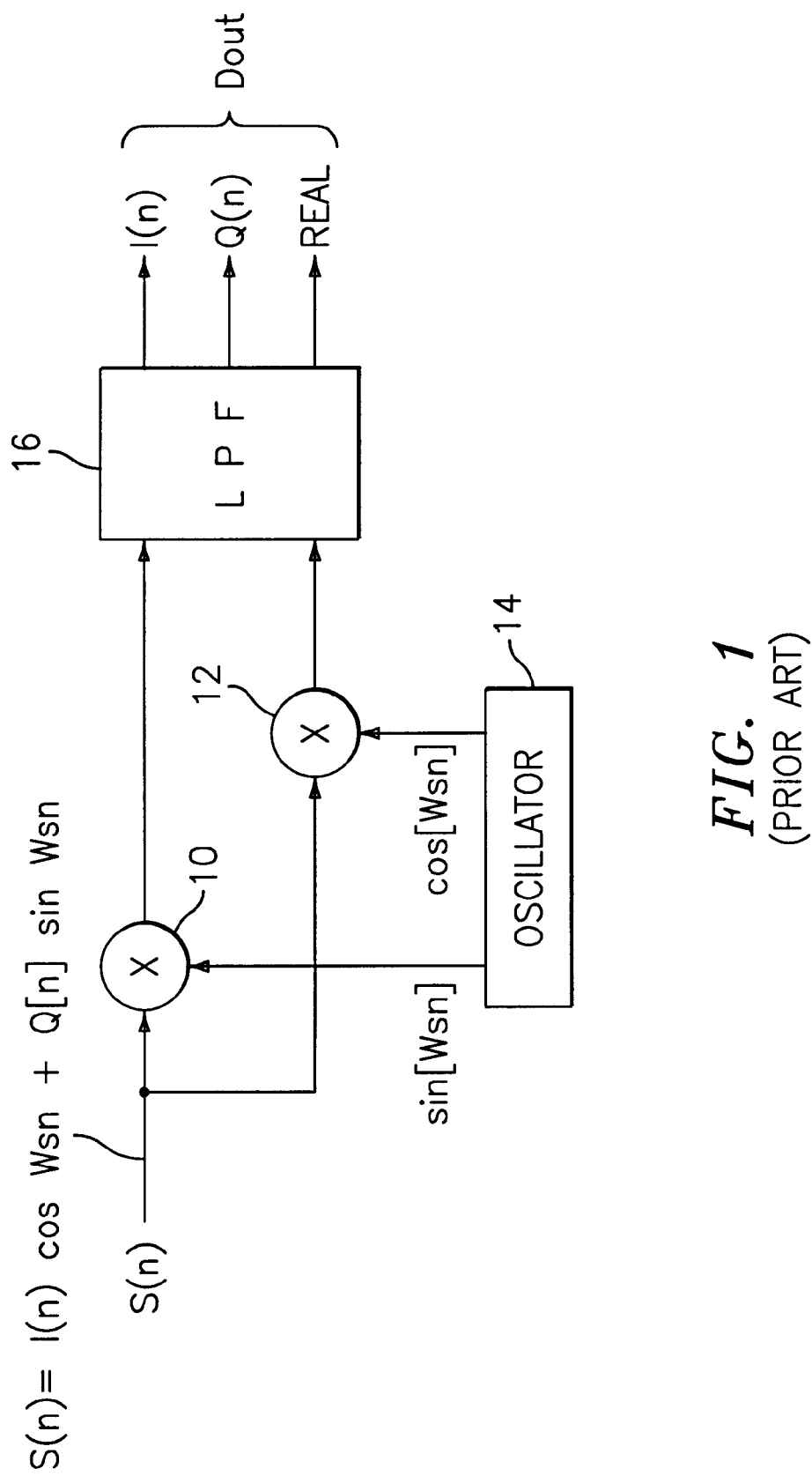
FIG. 1 is a block diagram of a conventional digital receiver.

In operation, the digital receiver of FIG. 2 differs greatly from the digital receiver of FIG. 1 in receiving the input signal. In the digital receiver of FIG. 1, the input signal which has passed through the A/D converter is multiplied by sinusoidal signals, cos[ ] and sin[ ], and then the resultant signals are transmitted to the next stage. However, in the digital receiver of FIG. 3, a received signal first has a sampling rate lowered by a down rate M of the down-sampler prior to multiplication by sinusoidal signals cos[ ] and sin[ ]. It will be appreciated that with multipliers 224 and 226 situated at the rear of the digital receiver that the sinusoidal signals cos[ ] and sin[ ] are multiplied by an input signal having the rate lowered by the down rate M. Note, the down rate M of the down-samplers depends upon the input signal to the receiver and is a common value for all down-samplers in the receiver.

The digital receiver of FIG. 2 is operated in two branches. The discrete time signal received from the A/D converter (X[n]) passes through (M−1) delays 210-1 ..., 210-n. In this case, the number of delays is less than a value corresponding to the down rate M by 1, which means that the hardware architecture, i.e. a number of stages of delay, is also input signal dependent because of the dependency of the down rate on the applied input signal. The outputs of the delays 210-1, ..., 210-n are convoluted in parallel with M filters 214-0, ..., 214-n and 220-0, ..., 220-n. The filters 214-0, ..., 214-n and 220-0, ..., 220-n have a polyphase structure of a filter which has a function for multiplying an output of the FIR filter shown in FIG. 1 by a complex gain including an intermediate frequency WS of a desired channel. The outputs of the filters 214-0, ..., 214-n and the outputs of the filters 220-0, ..., 220-n are all added to each other, and the respective sums are multiplied by the normalized complex gains $e^{-jW_sMn}$ and $e^{jW_sMn}$, respectively. The multiplication results are added to each other by adder 232, thereby obtaining an I component of the desired channel.

Similarly, in order to obtain a Q component, a difference between output signals of both branches is calculated by adder 231 and the difference is multiplied by −j in multiplier 228, as known from the correlation characteristic of the sinusoidal signals cos[ ] and sin[ ].

Figure 3:
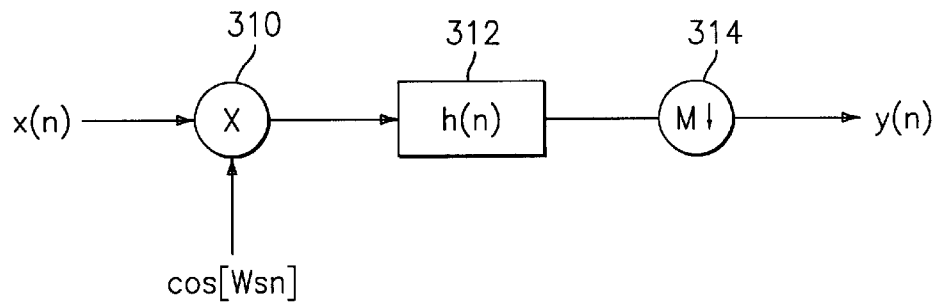
FIG. 3 is a block diagram illustrating a branch structure of a conventional digital receiver.

The digital receiver of FIG. 1 can be mathematically modeled by the diagram of FIG. 3. An output signal y[n] shown in FIG. 3 can be stated by:

$$y[n] = \sum_r h(Mn-r)\_x[r]\_\cos W_s r \qquad (2)$$

where x[n] is an input signal which has passed through the A/D converter, $W_s$ is a normalized intermediate frequency of a desired channel, h[n] is a system impulse response, and M is a down rate.

Figure 4:
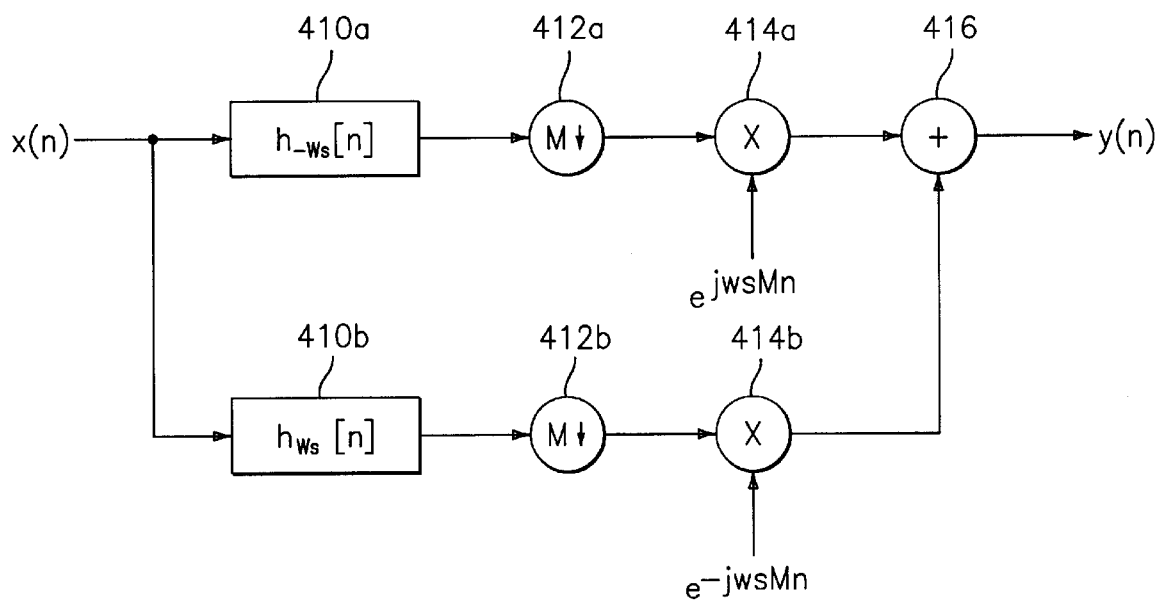
FIG. 4 is a block diagram illustrating a branch structure of the digital receiver of FIG. 2.

FIG. 4 illustrates a branch structure of the receiver of the present invention depicted in FIG. 2. The equivalence in the resulting output signals provided by FIG. 3 and that illustrated in FIG. 4 can be derived from the following equation. The above equation (2) can be represented by the following equation (3). That is:

$$\begin{aligned} y[n] &= \sum_r h[Mn-r] \cdot x[r] \cdot \left( \frac{e^{jW_s r} + e^{-jW_s r}}{2} \right) \\ &= \frac{1}{2} \sum_r h[Mn-r] \cdot x[r] \cdot (e^{jW_s(Mn-Mn+r)} + e^{-jW_sMn-Mn+r}) \\ &= \frac{1}{2} \sum_r h[Mn-r] \cdot x[r] \cdot (e^{jW_s r} + e^{-jW_s r}) \\ y[n] &= \frac{1}{2} e^{jW_sMn} \sum_r h[Mn-r] \cdot x[r] \cdot e^{-jW_s(Mn-r)} + \\ &\quad \frac{1}{2} e^{-jW_sMn} \sum_r h[Mn-r] \cdot x[r] \cdot e^{jW_s(Mn-r)} \end{aligned} \qquad (3)$$

While providing an equivalent signal, the multipliers of FIG. 4 are operated at a low frequency exponential function as compared to that in FIG. 3. Filters 410*a* and 410*b* can be designated as ½{h[n]e$^{-jWsn}$} and ½{h[n]e$^{jWsn}$}, respectively.

In the present invention, the filters 410*a* and 410*b* indicated in FIG. 4 are polyphase filters. Down-samplers 412*a* and 412*b* and the filters 410*a* and 410*b* are interchanged in position by "The Noble Identities". For details for "The Noble Identities", refer to Vaidyanathan, "Multirate System and Filter Banks" pp. 119–122, Englewood Cliffs, 1993. This is illustrated in the digital receiver of FIG. 2.

The z-Transform $H_{Ws,K}(z)$ of the filters 214-0, . . . , 214-n shown in FIG. 2 is as follows:

$$H_{Ws,K}(z) = \sum_n h_{Ws}(K + Mn)z^{-n}, 0 \le K \le M - 1$$

The z-Transform $H_{-Ws,K}(z)$ of the filters 220-0, . . . , 220-n shown in FIG. 2 is as follows:

$$H_{-Ws,K}(z) = \sum_n h_{-Ws}(K + Mn)z^{-n}, 0 \le K \le M - 1$$

where $H_{Ws,K}(z)$ is the z-Transform of a polyphase filter of $h_{Ws}[n]$, and $H_{-Ws,K}(z)$ is the Z-Transform of a polyphase filter of $h_{-Ws}[n]$.

In the digital receiver constructed in accordance with equation (3) and "The Noble Identities", the input signal x[n] is applied to the filters 214-0 and 220-0 through the down-samplers 212-0 and 218-0. The outputs filtered through the filters 214-0 and 220-0 by $H_{Ws,K}(z)$ and $H_{-Ws,K}(z)$ are supplied to the adders 216-1 and 222-1. The input signal x[n] is sequentially delayed by the delays 210-1, . . . , 210-n and is then applied to the down-samplers 212-1, . . . , 212-n and 218-1–218-n in which their sampling rates are down. The outputs of the down-samplers 212-1, . . . , 212-n and 218-1–218-n are filtered through the filters 214-1, . . . , 214-n and 220-1, . . . , 220-n. The outputs of the filters 214-1, . . . , 214-n and 220-1, . . . , 220-n are supplied to the adders 216-1–216-n and 222-1, . . . , 222-n. The two signals applied to the adders 216-1 and 222-1 are combined as a sum signal which is applied to the adder of the next stage. The output signals of the adders 216-n and 222-n are applied to the multipliers 224 and 226. These signals are then multiplied by $e^{-jWsMn}$ and $e^{jWsMn}$, respectively. The outputs of the multipliers 224 and 226 are applied to the adder 230. The adder 230 generates a difference signal between the outputs of the multipliers 224 and 226. The output of the adder 230 is applied to the multiplier 228 where it is multiplied by –j, thereby generating a Q channel signal. The outputs of the multipliers 224 and 226 are supplied to the adder 232 which generates a sum signal therefrom. The sum signal produced from the adder 232 is the final output signal y[n] corresponding to an I channel.

As described above, the inventive digital receiver of a polyphase structure reduces the signal rate of an input terminal within the range of a unique characteristic of a signal by using "The Noble Identities". The digital receiver which can process an input signal at a high processing rate is obtained by a commercially available DSP. Since it is possible to process signals in parallel according to a unique characteristic of the polyphase structure, the digital receiver according to the present invention exhibits a faster signal processing rate than that of a conventional digital receiver. Therefore, the efficiency of a system is maximized.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A digital receiver for receiving a digital input signal converted by a given sampling rate, comprising:

a plurality of delays connected in series for sequentially delaying said digital input signal, wherein a first of said plurality of delays receives said digital input signal;

a first branch, comprising:

a first down-sampler having an input that receives said digital input signal for lowering a sampling rate of said digital input signal;

a first plurality of down-samplers for lowering a sampling rate of said sequentially delayed digital input signal, wherein each of said plurality of down-samplers receives a signal from one of said plurality of delays;

a first filter for selecting a signal of a desired channel from a signal received from said first down-sampler;

a first plurality of filters for selecting signals of a desired channel from signals received from said first plurality of down-samplers, wherein each of said first plurality of filters receives a signal from one of said first plurality of down-samplers, and wherein each of said first plurality of filters is therein associated with said one of said first plurality of down-samplers; and a first plurality of adders connected in series, wherein each of said plurality of adders is associated with one of said first plurality of delays;

wherein each of said first plurality of down-samplers and associated filters is connected between an output of one of said first plurality of delays and an input of said associated adder, and a first adder of said first plurality of adders receives its signal from said first filter;

a second branch, comprising:

a second down-sampler having an input that receives said digital input signal for lowering a sampling rate of said digital input signal;

a second filter for selecting a signal of a desired channel from a signal received from said second down-sampler;

a second plurality of down-samplers for lowering a sampling rate of said sequentially delayed digital input signal, wherein each of said second plurality of down-samplers receives a signal from one of said second plurality of delays;

a second plurality of filters for selecting signals of a desired channel from signals received from said plurality of down-samplers, wherein each of said second plurality of filters receives a signal from one of said second plurality of down-samplers, and wherein each of said second plurality of filters is therein associated with said one of said second plurality of down-samplers; and a second plurality of adders connected in series, wherein each of said second plurality of adders is associated with one of said second plurality of delays;

wherein each of said second plurality of down-samplers and associated filters is connected between an output of one of said second plurality of delays and an input of said associated adder, and a first adder of said second plurality of adders receives its signal from said second filter;

a first multiplier for multiplying an output of a last adder of said first branch by a first multiplying factor;

a second multiplier for multiplying an output of a last adder of said second branch by a second multiplying factor;

a second adder for adding outputs of said first and second multipliers to each other to generate a signal corresponding to an I channel;

a third adder for generating a difference between outputs of said first and second multipliers; and a third multiplier for multiplying an output of said third adder by a complex number to generate a signal corresponding to a Q channel.

2. A digital receiver as claimed in claim 1, wherein said first multiplying factor is substantially equal to $e^{-jW_sMn}$, and said second multiplying factor is substantially equal to $e^{jW_sMn}$, where Ws is an intermediate frequency of a desired channel, M is a down sampling rate, and n is a unit of time.

3. A digital receiver as claimed in claim 2, wherein said second plurality of filters filter a desired channel by the z-Transform given by:

$$H_{-W_s,K}(z) = \sum_n h_{-W_s}(K + Mn)z^{-n}, 0 \leq K \leq M - 1$$

where M is a down rate.

4. A digital receiver as claimed in claim 3, wherein said first plurality of filters filter a desired channel by the z-Transform given by:

$$H_{W_s,K}(z) = \sum_n h_{W_s}(K + Mn)z^{-n}, 0 \leq K \leq M - 1$$

where M is a down rate.

5. A digital receiver as claimed in claim 4, wherein said down rate is selected based upon the digital input signal, such that aliasing is minimized.

6. A digital receiver as claimed in claim 5, wherein said first and second plurality of filters each have a polyphase structure.

7. The digital receiver as claimed in claim 1, wherein said first down-samplers and said first filter are interchanged, and wherein each of said first and second pluralities of down-samplers are interchanged with its associated filter.

* * * * *